United States Patent
Guntreddi et al.

(10) Patent No.: US 9,863,982 B2
(45) Date of Patent: Jan. 9, 2018

(54) BI-DIRECTIONAL CURRENT SENSING CIRCUIT

(71) Applicant: QUALCOMM Incorporated, San Diego, CA (US)

(72) Inventors: Ranjit Kumar Guntreddi, Singapore (SG); Zengjing Wu, Singapore (SG); Zhaohui Zhu, San Jose, CA (US); Gianluca Valentino, Singapore (SG)

(73) Assignee: QUALCOMM Incorporated, San Diego, CA (US)

( * ) Notice: Subject to any disclaimer, the term of this patent is extended or adjusted under 35 U.S.C. 154(b) by 107 days.

(21) Appl. No.: 14/871,636

(22) Filed: Sep. 30, 2015

(65) Prior Publication Data

US 2017/0089958 A1  Mar. 30, 2017

(51) Int. Cl.
*G01R 19/00* (2006.01)
*G05F 1/10* (2006.01)
(Continued)

(52) U.S. Cl.
CPC ........... *G01R 19/0092* (2013.01); *G05F 1/10* (2013.01); *H02M 3/156* (2013.01); *H02M 2001/0009* (2013.01)

(58) Field of Classification Search
CPC ..... H01L 23/50; H02M 1/10; H02M 3/33507; H02M 2001/007; H02M 3/156;
(Continued)

(56) References Cited

U.S. PATENT DOCUMENTS 5,751,140 A * 5/1998 Canter .................. H02M 3/158
323/282

6,137,280 A * 10/2000 Ackermann .......... H02J 7/0008
323/224
(Continued)

FOREIGN PATENT DOCUMENTS

EP  2173031 A1  4/2010

OTHER PUBLICATIONS

International Search Report—PCT/US2016/055037—ISA/EPO—dated Feb. 16, pp. 1-5.
Written Opinion of the International Searching Authority—PCT/US2016/055037—ISA/EPO—dated Feb. 16, pp. 1-6.
"Creating a Bidirectional Current-Sense Amplifier from Two Unidirectional Current-Sense Amplifiers," Application Note 3906, Retrieved date Jul. 15, 2015, Retrieved from the Internet URL: http://www.maximintegrated.com/en/appnotes/index.mvp/id/3906, 5 Pages.

*Primary Examiner* — Vinh Nguyen
(74) *Attorney, Agent, or Firm* — Haynes and Boone, LLP (57) ABSTRACT

The embodiments described herein relate to an improved circuit technique for sensing current conducting in a power transistor coupled with an input power supply. The circuit includes a bi-directional current sensing circuit using current sensing transistor gate control. The circuit includes a forward current sensing transistor to sense current conducting in the power transistor during forward mode current of the circuit and a reverse boost current sensing transistor to sense current conducting during reverse current mode of the circuit. A level shifter is also provided with complementary outputs to either turn on the forward current sensing transistor or turn off the reverse boost current sensing transistor when the circuit is in forward current mode, or to turn off the forward current sensing transistor and turn on the reverse boost current sensing transistor when the circuit is in reverse current mode.

30 Claims, 7 Drawing Sheets

(51) Int. Cl.
*H02M 3/156* (2006.01)
*H02M 1/00* (2006.01)

(58) Field of Classification Search
CPC ......... H02M 3/335; H02M 2001/0025; H02M 2001/0074; H02M 2001/0012; H02M 3/1582; H02M 3/3353; G06F 1/26; G06F 13/10; G06F 1/305; G06F 1/266; G06F 1/28; G05B 15/02; H01R 31/065; H02P 9/305; H03F 1/0227; H03F 1/025; H03F 1/3247; H03F 2200/432; H03F 3/217; H03B 5/1212; H03B 5/1221; H03B 5/1228; H03K 17/04106; G01R 19/0092
See application file for complete search history.

(56) References Cited

U.S. PATENT DOCUMENTS

| | | |
|---|---|---|
| 6,617,838 B1 | 9/2003 | Miranda et al. |
| 7,138,786 B2 | 11/2006 | Ishigaki et al. |
| 8,796,998 B2 | 8/2014 | Wolf et al. |
| 2005/0151543 A1 | 7/2005 | Taylor |
| 2014/0049238 A1 | 2/2014 | Hu et al. |
| 2014/0203761 A1 | 7/2014 | Paparrizos et al. |
| 2014/0347001 A1 | 11/2014 | Sporck et al. |

* cited by examiner

BI-DIRECTIONAL CURRENT SENSING CIRCUIT

FIELD OF THE INVENTION

At least certain embodiments disclosed herein relate generally to electronic circuits, and more particularly to an improved bi-directional current sensing circuit and method.

BACKGROUND

Power conversion circuitry is employed in many applications, such as in portable devices, which utilize an external power source to operate the device and/or to charge internal batteries of the device. In many instances the current drawn from a source may need to be limited according to specifications published for devices drawing power from the connection. For instance, with a universal serial bus (USB) power supply connection, portable devices may be limited to drawing at most 500 mA from a USB 2.0 connection. Similarly, USB 3.0 connections are typically limited to drawing 900 mA of current.

Power conversion circuitry provides power conversion with current limiting using current sensing. Current sensing circuitry may be important in various power conversion devices such as battery chargers, switched-mode chargers, power converters, voltage regulators, etc. Bi-directional current sensing is needed to monitor the current in such devices during forward current mode and reverse current mode. The sensed current information may then be used for regulating the forward or reverse currents in the device, and also for fuel gauging to compute charge transfer in and out of the battery.

Figure 1:
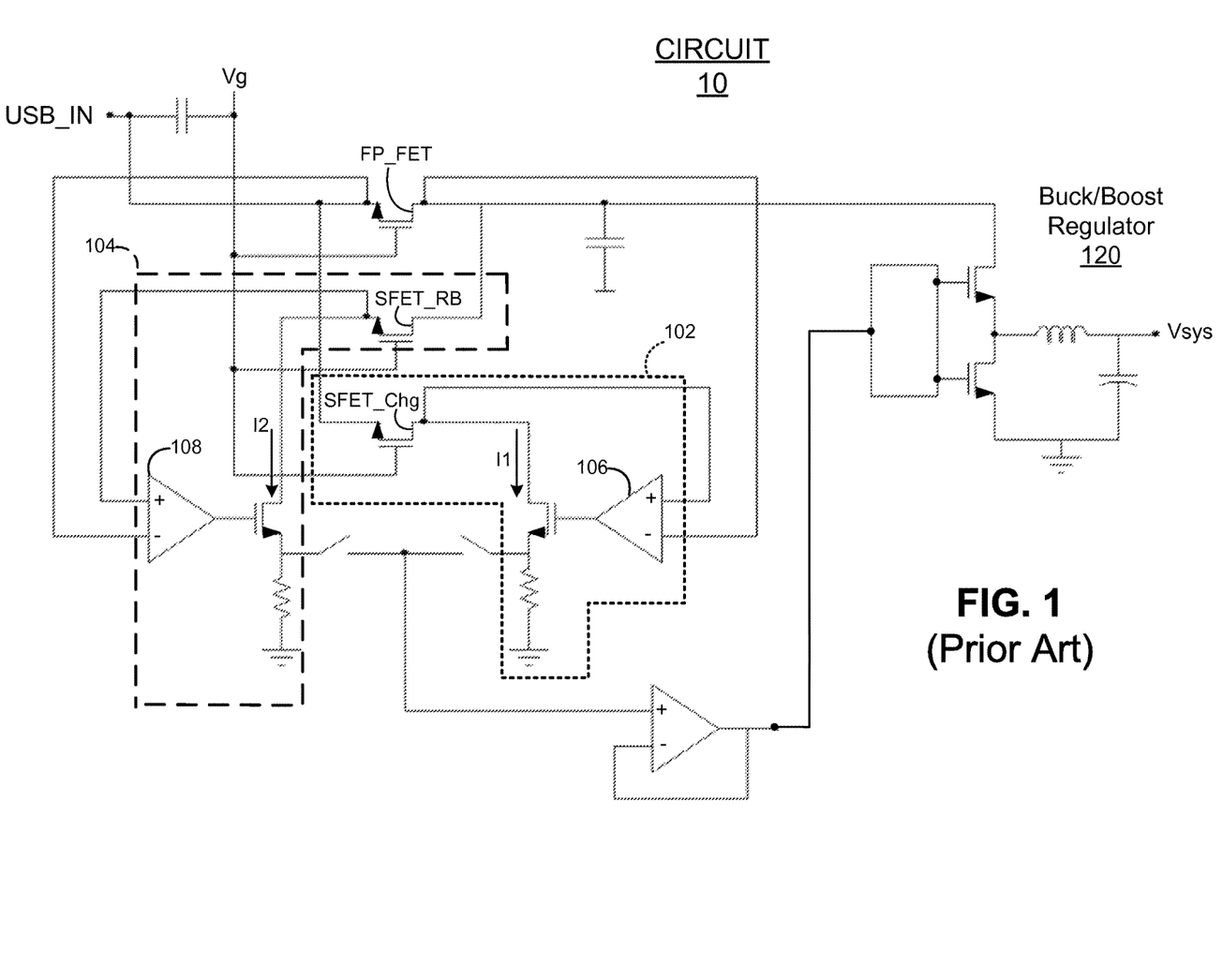
FIG. 1 depicts an example of a conventional current sensing circuit utilized in a switched-mode power charger according to the prior art.

Conventional designs of current sensing devices require two independent uni-directional loops to monitor the current in both the forward and reverse directions. FIG. 1 depicts an example of a conventional current sensing circuit utilized in a switched-mode charger according to the prior art. As shown, current sensing circuit 10 includes a USB_IN input power source configured to supply current to a buck/boost power regulator 120.

Circuit 10 includes two independent current sensing loops 102 and 104 for sensing current flow in both the forward and reverse directions respectively. In particular, current sensing circuit 10 includes a first independent loop 102 comprising a forward current sensing transistor SFET_Chg and a first operational amplifier 106, and a second independent loop 104 comprising a reverse current sensing transistor SFET_RB and a second operational amplifier 108.

During forward current mode, forward current flows into the device from the USB_IN input through a front porch FET transistor FP_FET and into the power regulator 120. The feedback loop 102 comprising the forward current sensing transistor SFET_Chg and operational amplifier 106 senses this current and is configured to equalize the drain-to-source voltage Vds of the power transistor FP_FET and the forward current sensing transistor SFET_Chg such that a sensed current "I1" will be a replica of the forward current.

During reverse current mode, current flows out of the power regulator 120 and back into the front porch power transistor FP_FET in the opposite direction. The feedback loop 104 comprising the reverse current sensing transistor SFET_RB and the operational amplifier 108 senses this reverse current and is configured to equalize the drain-to-source voltage Vds of the front porch transistor FP_FET and the reverse current sensing transistor SFET_RB such that a sensed current "I2" will be a replica of the reverse current.

Such circuits however occupy a significant amount of integrated die area, requiring two independent current sensing operational amplifiers 106 and 108, thereby increasing cost and design complexity.

SUMMARY

The embodiments described herein relate to an improved circuit technique for sensing current conducting in a power transistor coupled between an input power supply and a power regulator. In one embodiment, the circuit includes an area efficient bi-directional current sensing circuit using current sensing transistor gate control. The circuit includes a first current sensing transistor coupled between a current sensing circuit node and a first terminal of the power transistor. The first current sensing transistor can be configured to sense current conducting in the power transistor during a forward current mode of the circuit. The circuit further includes a second current sensing transistor coupled between the current sensing circuit node and a second terminal of the power transistor. The second current sensing transistor can be configured to sense current conducting in the power transistor during a reverse current mode of the circuit. The first and second current sensing transistors form a series connection in parallel with the power transistor.

The circuit also includes a level shifter configured to provide complementary outputs depending on the mode of the circuit. The level shifter includes a first output coupled with the gate terminal of the first current sensing transistor to activate or deactivate the first current sensing transistor, and a second output coupled with the gate terminal of the second current sensing transistor to activate or deactivate the second current sensing transistor. The complementary outputs of the level shifter are configured to either turn on the first current sensing transistor and turn off the second current sensing transistor when the circuit is in forward current mode, or turn off the first current sensing transistor and turn on the second current sensing transistor when the circuit is in reverse current mode.

The circuit comprises two current sensing loops including a first current sensing loop and a second current sensing loop. Only one of the current sensing loops is active at any one time based on the complementary outputs of the level shifter. The first current sensing loop comprises the first current sensing transistor coupled with an operational amplifier and the second current sensing loop comprises the second current sensing transistor coupled with the operational amplifier. The operational amplifier is configured to equalize voltage of the first terminal of the power transistor with a voltage of a corresponding terminal of the first current sensing transistor, or to equalize voltage of the second terminal of the power transistor with a voltage of a corresponding terminal of the second current sensing transistor.

The circuit further comprises selection logic configured for selecting between sensing forward and reverse currents in the power transistor based on the mode of the circuit. The output of the selection logic will either be a signal mirroring the voltage at the first terminal of the power transistor during forward current mode, or a signal mirroring the voltage at the second terminal of the power transistor during reverse current mode.

In another embodiment, a method for sensing current conducting in a power transistor coupled between an input power supply and a power regulator is described. The method comprises sensing current conducting in the power transistor during a forward current mode of the circuit at a first current sensing transistor coupled between a current sensing node of the circuit and a first terminal of the power transistor, and sensing current conducting in the power transistor during a reverse current mode of the circuit at a second current sensing transistor coupled between the current sensing node of the circuit and a second terminal of the power transistor. The first and second current sensing transistors form a series connection in parallel with the power transistor.

The method further comprises providing complementary outputs from a level shifter depending on the mode of the circuit. The level shifter includes a first output coupled with the gate terminal of the first current sensing transistor to activate or deactivate the first current sensing transistor, and a second output coupled with the gate terminal of the second current sensing transistor to activate or deactivate the second current sensing transistor.

The method activates only one of a first current sensing loop comprising the first current sensing transistor or a second current sensing loop comprising the second current sensing transistor at a time based on the complementary outputs of the level shifter by either turning on the first current sensing transistor and turning off the second current sensing transistor when the circuit is in forward current mode, or turning off the first current sensing transistor and turning on the second current sensing transistor when the circuit is in reverse current mode.

The method further comprises selecting between sensing the forward current or the reverse current in the power transistor based on the mode of the circuit. The output of the selection logic will either be a signal mirroring the voltage of the first terminal of the power transistor during forward current mode, or a signal mirroring the voltage of the second terminal of the power transistor during reverse current mode.

In yet other embodiments, a circuit means for sensing current conducting in a power transistor coupled between an input power supply and a power regulator is described. The circuit means includes a means for sensing current conducting in the power transistor during a forward current mode of the circuit at a first current sensing transistor coupled between a current sensing circuit node and a first terminal of the power transistor, means for sensing current conducting in the power transistor during a reverse current mode of the circuit at a second current sensing transistor coupled between the current sensing circuit node and a second terminal of the power transistor, means for providing complementary outputs from a level shifter depending on the mode of the circuit, where the level shifter includes a first output coupled with the gate terminal of the first current sensing transistor to activate or deactivate the first current sensing transistor, and a second output coupled with the gate terminal of the second current sensing transistor to activate or deactivate the second current sensing transistor, and a means for activating only one of a first current sensing loop comprising the first current sensing transistor and a second current sensing loop comprising the second current sensing transistor at a time based on the complementary outputs of the level shifter.

The following detailed description and accompanying drawings provide a better understanding of the nature and advantages of the present invention.

BRIEF DESCRIPTION OF THE DRAWINGS

For a better understanding of at least certain embodiments, reference will be made to the following detailed description, which is to be read in conjunction with the accompanying drawings.

DETAILED DESCRIPTION

Throughout the description, for the purposes of explanation, numerous specific details are set forth in order to provide a thorough understanding of the present invention. It will be apparent to one skilled in the art, however, that the techniques described herein may be practiced without some of these specific details. In other instances, well-known structures and devices may be shown in block diagram form to avoid obscuring the underlying principles of the invention.

In addition, provided below is a description of an example system upon which the embodiments described herein may be implemented. Although certain elements may be depicted as separate components, in some instances one or more of the components may be combined into a single device or system. Likewise, although certain functionality may be described as being performed by a single element or component within the system, the functionality may in some instances be performed by multiple components or elements working together in a functionally coordinated manner.

I. Exemplary Circuit

Provided below is a description of an example circuit upon which the embodiments described herein may be implemented. Although certain elements may be depicted as separate components, in some instances one or more of the components may be combined into a single component or device. Likewise, although certain functionality may be described as being performed by a single element or component within the circuit, the functionality may in some instances be performed by multiple elements or components working together in a functionally coordinated manner.

In addition, hardwired circuitry may be used independently or in combination with firmware or software instructions to implement the techniques described herein. The described functionality may be performed by custom hardware components containing hardwired logic for performing operations, or by any combination of hardware, firmware, and programmed computer components. The techniques described herein are not limited to any specific combination of hardware circuitry.

Figure 2:
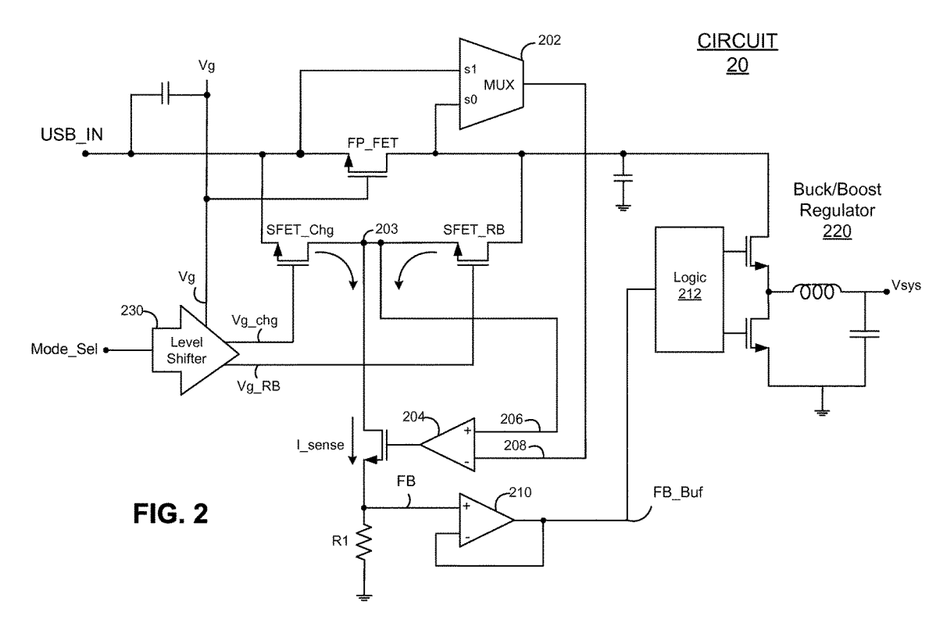
FIG. 2 depicts an example circuit diagram of an embodiment of an area-efficient bi-directional current sensing circuit using current sensing transistor gate control.

FIG. 2 depicts an example circuit diagram of an embodiment of an area efficient bi-directional current sensing circuit using current sensing transistor gate control. Bi-directional current sensing circuit 20 includes a USB_IN power input configured for forward current and/or reverse current in a buck/boost regulator 220. The configuration of circuit 20 combines two uni-directional current sensing feedback loops into a single bi-directional current sensing circuit configured such that only one feedback loop is activated at any one time, and thus only one operational amplifier is required for current sensing in both the forward and reverse current directions.

Circuit 20 is configured for sensing current in the forward and reverse current directions respectively. In the illustrated embodiment, circuit 20 includes a front porch power transistor FP_FET, a forward current sensing transistor SFET_Chg, and a reverse current sensing transistor SFET_RB. Circuit 20 further comprises a multiplexer ("MUX") 202 for selecting between sensing the forward or reverse current based on the selected mode (mode_sel signal), a level shifter circuit 230 configured to turn on/off the forward and reverse current sensing transistors SFET_Chg and SFET_RB, respectively, and an operational amplifier 204 configured for sensing either the forward or reverse current and for equalizing the drain-to-source voltage Vds of the power transistor FP_FET with either the forward current sensing transistor SFET_Chg during forward current mode or the reverse boost current sensing transistor SFET_RB during reverse current mode.

Circuit 20 also includes an operational amplifier 210 for buffering the feedback signal "FB" via resistor R1 to generate a buffered feedback voltage FB_Buf, which is supplied to the buck/boost regulator 220 via an input logic block 212. As shown, the buck/boost regulator 220 includes an inductor and a capacitor coupled with two input transistors. The buck/boost regulator 220 can be a voltage step down circuit adapted to step down the input power voltage supplied by USB_IN to a lower voltage "Vsys" for use by internal components of the system, such as a processor, microcontroller, etc.

It should be noted that, although certain embodiments may be described herein as utilizing FET ("field effect transistor") technology, the circuit techniques described herein are not limited to any particular semiconductor technology. It will be appreciated by persons of skill in the art that other types of transistors or equivalent devices may be used to implement the embodiments described herein. For example, embodiments may be implemented in transistor technologies including MOSFET, JFET, BJT, IGBT, GaAs, etc. In addition, it should further be noted that although the techniques described herein are based on an NFET transistor configuration, persons of skill in the art will appreciate that these techniques can also be based on a PFET transistor configuration as such is a simple design choice for a circuit designer.

It should further be noted that although the embodiments described herein include receiving power via a USB input, the embodiments are not so limited. The techniques described herein can be configured to receive input power from any type of power source, of which a USB input is only one example.

The level shifter circuit 230 only activates one of the feedback loops at any given time interval depending on the mode_sel signal at the input. The gates of the current sensing transistors SFET_Chg and SFET_RB are driven by complementary output signals from the level shifter 230. The level shifter circuit 230 is configured to either turn on the forward current sensing transistor SFET_Chg and turn off the reverse boost current sensing transistor SFET_RB, or turn off the forward current sensing transistor SFET_Chg and turn on the reverse boost current sensing transistor SFET_RB.

On its complementary outputs, the level shifter 230 provides an output voltage that swings between Vg (input voltage of circuit 20) and USB_IN−ΔV (USB_IN minus ΔV) depending on the state of the mode_sel input signal. During forward current mode the state of the mode_sel signal can be set to 0, and during reverse current mode the state of the mode_sel signal can be set to 1. The level shifter 230 can be designed such that the output voltage Vg is high enough to turn on the current sensing transistors SFET_Chg or SFET_RB, and such that the output voltage USB_IN−ΔV is low enough to turn off the current sensing transistors SFET_Chg or SFET_RB. The level shifter 230 is described in more detail in FIG. 5 discussed below.

During forward current mode, the level shifter 230 outputs the gate voltage Vg to the input gate voltage Vg_Chg of the forward current sensing transistor SFET_Chg, and the level shifter 230 outputs USB_IN−ΔV to the input gate voltage Vg_RB of the reverse boost current sensing transistor SFET_RB. This has the effect of turning on the current sensing transistor SFET_Chg and turning off the reverse boost current sensing transistor SFET_RB. Thus only SFET_Chg will be active and mirroring the forward current in forward current mode.

During reverse current mode, the level shifter 230 outputs the gate voltage Vg to the input gate voltage Vg_RB of the reverse boost current sensing transistor SFET_RB and the level shifter 230 outputs USB_IN−ΔV to the input gate voltage Vg_Chg of the forward current sensing transistor SFET_Chg. This has the effect of turning off the current sensing transistor SFET_Chg and turning on the reverse boost current sensing transistor SFET_RB. Thus only SFET_RB will be active and mirroring the reverse current in reverse boost mode.

In such a configuration, the circuit 20 is either sensing the forward current in forward current mode or sensing the reverse current in reverse boost mode. MUX 202 is configured to select between the drain and source terminals of the power transistor FP_FET in forward and reverse boost modes, respectively, depending on the state of the mode_sel signal. When the state of the mode_sel signal is set equal to 0, forward current mode is selected and the input s0 of MUX 202 will be active while input s1 is inactive. The s0 input of the MUX 202 will receive the signal from the drain terminal of the power transistor FP_FET. When the state of the mode_sel signal is set equal to 1, reverse current mode is selected and the s1 input of the MUX 202 will be active while the input s0 is inactive. The s1 input of the MUX 202 will receive the signal from the source terminal of the power transistor FP_FET. The output of MUX 202 will therefore either be a signal mirroring the voltage taken at the drain terminal of the power transistor FP_FET when forward current mode is selected, or a signal mirroring the voltage taken at the source terminal of FP_FET when the reverse boost mode is selected.

It should be noted that although the embodiments herein are described in terms of utilizing a multiplexer circuit 202 as the selection logic, the techniques described herein are not limited to any particular type or configuration of selection logic. Persons of skill in the art will recognize that other equivalent selection logic configurations can be used, of which a multiplexer is only one example.

The voltage signal at the output of the MUX 202 is provided to the negative (−) input 208 of the operational amplifier 204. The positive (+) input 206 of the operational amplifier is supplied with either the voltage signal taken at the current sensing node 203 via the forward current sensing transistor SFET_Chg during forward current mode, or the voltage signal taken at the current sensing node 203 via the reverse boost current sensing transistor SFET_RB during reverse current mode.

During forward current mode, the feedback loop comprising the forward current sensing transistor SFET_Chg and the operational amplifier 204 is configured to sense the forward current and to equalize the drain-to-source voltages Vds of FP_FET and SFET_Chg such that the sensed current I_sense mirrors the forward current. During reverse current mode, the feedback loop comprising the reverse current sensing transistor SFET_RB and the operational amplifier 204 is configured to sense the reverse current and to equalize the drain-to-source voltage Vds of FP_FET and SFET_RB such that the sensed current I_sense mirrors the reverse boost current.

The sensed current I_sense is then provided as a feedback signal FB via resistor R1, and is buffered in operational amplifier 210 to produce a buffered feedback voltage FB_Buf. The buffered feedback FB_Buf can then be supplied to the input logic block 212 of the buck/boost regulator 220. The buck/boost regulator 220 can be configured to receive this feedback current and use it for regulating the forward and reverse currents in the device, and also for fuel gauging to compute charge transfer in and out of the device as discussed above.

Figure 3:
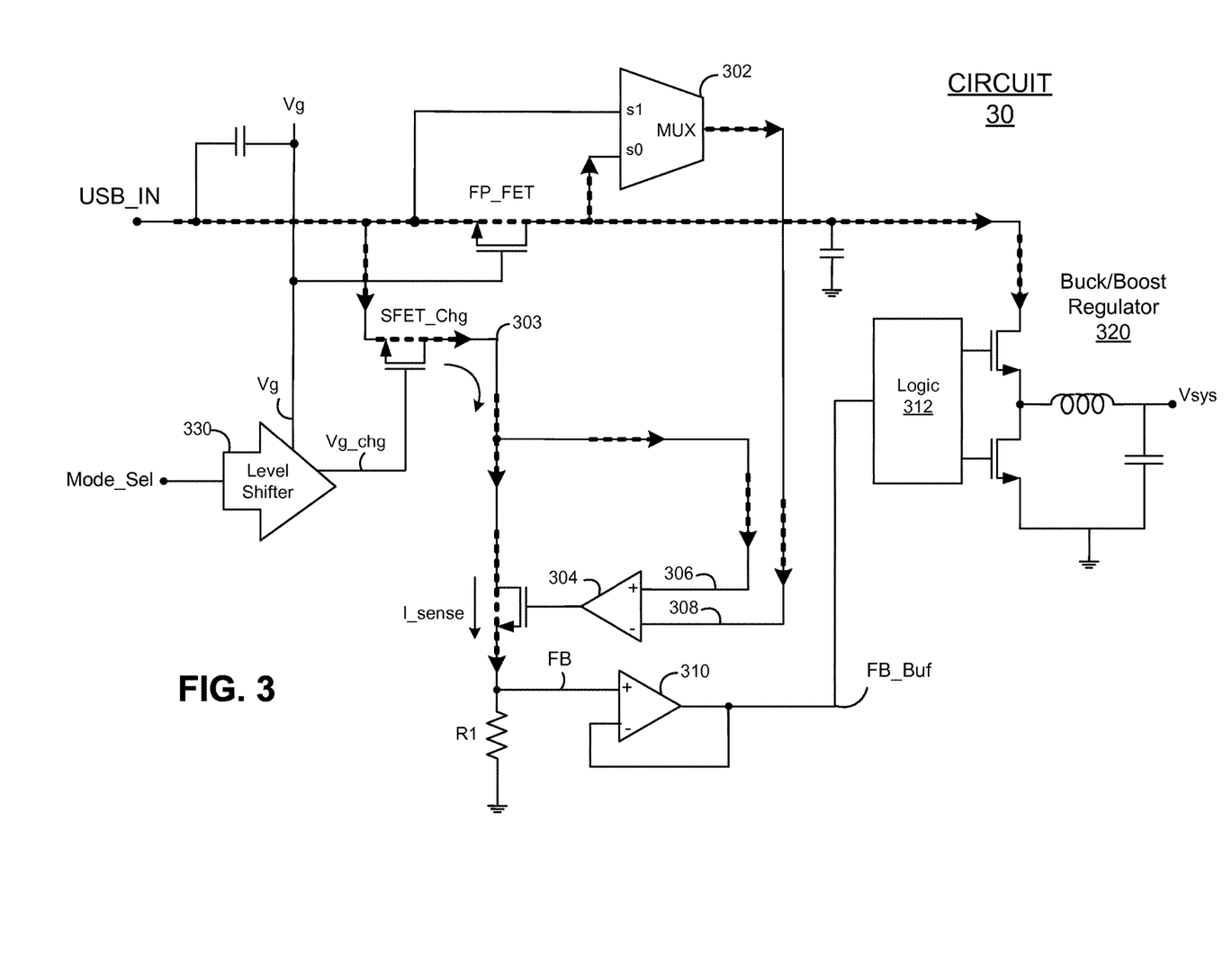
FIG. 3 depicts an equivalent circuit for the example circuit diagram embodiment of FIG. 2 during forward current mode.

FIG. 3 depicts an equivalent circuit for the example circuit diagram embodiment of FIG. 2 during forward current mode. As shown in the illustrated embodiment, during forward current mode power flows in from USB_IN through the front porch power transistor FP_FET and into the buck/boost regulator 320. The mode_sel signal is set equal to 0 and therefore the output of the level shifter 330 supplies voltage signal Vg to the gate terminal of SFET_Chg to turn it on and supplies USB_IN−ΔV to the gate terminal of SFET_RB to turn it off. Forward current therefore flows through SFET_Chg and into the circuit as shown.

The s0 input of MUX 302 is selected and the voltage signal Vd at the drain terminal of FP_FET is provided at the output of the MUX 302 and is supplied to the negative (−) input terminal 308 of the operational amplifier 304. The positive (+) input terminal 306 of the operational amplifier 304 is supplied with the voltage signal at the current sensing node 303 via transistor SFET_Chg. The feedback loop comprising the forward current sensing transistor SFET_Chg and the operational amplifier 304 is configured to sense the forward current and to equalize the drain-to-source voltages Vds of FP_FET and SFET_Chg such that the sensed current I_sense mirrors the forward current.

I_sense is then provided as a feedback voltage FB via resistor R1, and is buffered in operational amplifier 310 to produce a buffered feedback voltage FB_Buf. The buffered feedback FB_Buf can then be supplied to the input logic block 312 of the buck/boost regulator 320.

Figure 4:
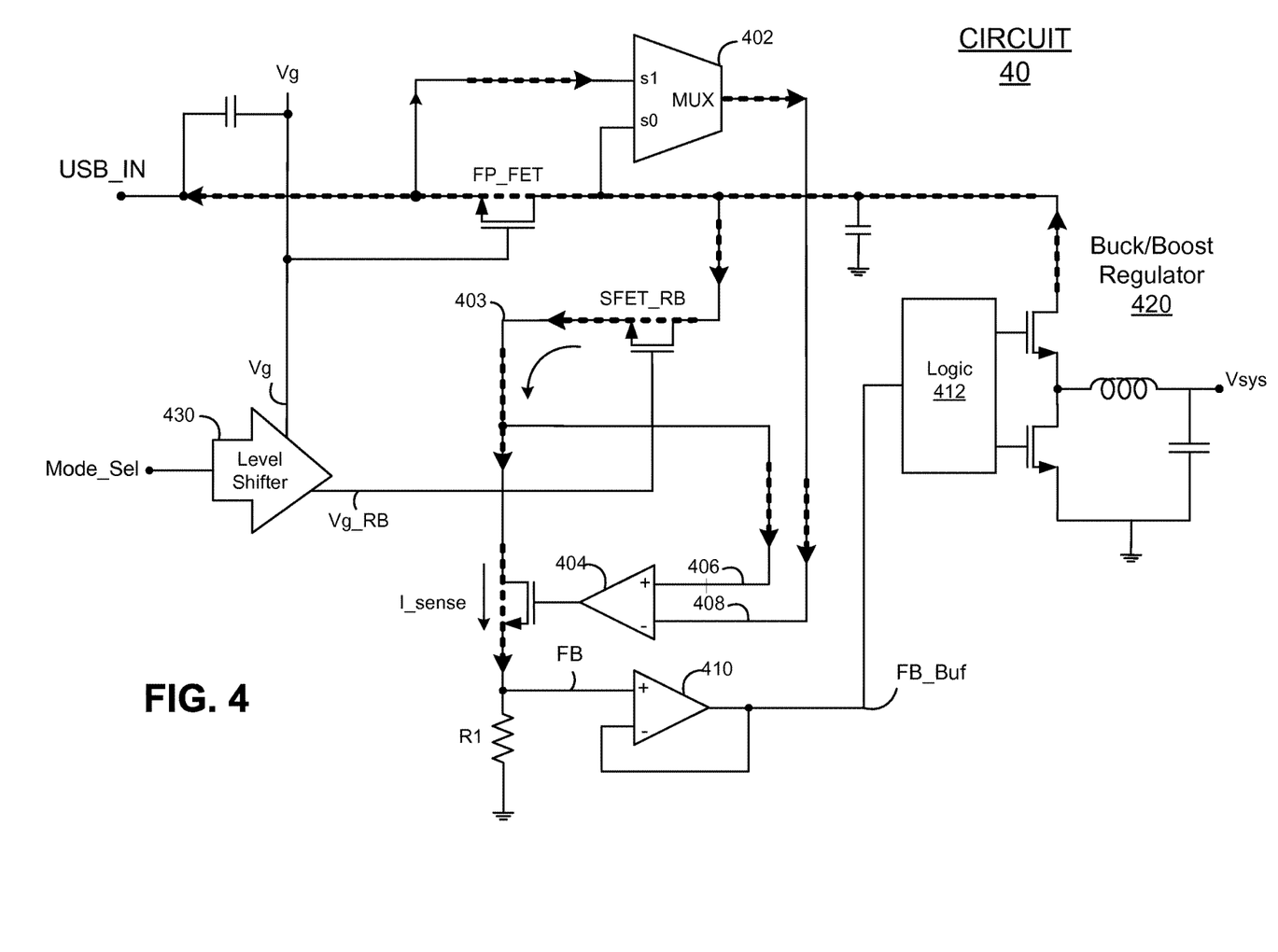
FIG. 4 depicts an equivalent circuit for the example circuit diagram embodiment of FIG. 2 during reverse current mode.

FIG. 4 depicts an equivalent circuit for the example circuit diagram embodiment of FIG. 2 during reverse current. As shown in the illustrated embodiment, in reverse current mode USB_IN is no longer supplying power to the circuit. Instead, the power accumulated in the buck/boost regulator 420 flows back from the buck/boost regulator 420 through the front porch power transistor FP_FET in the opposite direction. The mode_sel signal is set equal to 1 and therefore the output of the level shifter 430 supplies voltage signal Vg to the gate terminal of SFET_RB to turn it on and supplies USB_IN−ΔV to the gate terminal of SFET_Chg to turn it off. Reverse boost current therefore flows through SFET_RB and into the circuit as shown.

The s1 input of MUX 402 is selected and the voltage signal Vs at the source terminal of FP_FET is provided at the output of the MUX 402 and is supplied to the negative (−) input terminal 408 of the operational amplifier 404. The positive (+) input 406 of the operational amplifier 404 is supplied with the voltage signal at the current sensing node 403 via transistor SFET_RB. The feedback loop comprising the reverse boost current sensing transistor SFET_RB and the operational amplifier 404 is configured to sense the reverse current and to equalize the drain-to-source voltages Vds of FP_FET and SFET_RB such that the sensed current I_sense mirrors the reverse current.

I_sense is then provided as a feedback signal "FB" via resistor R1, and is buffered in operational amplifier 410 to produce a buffered feedback voltage FB_Buf. The buffered feedback voltage FB_Buf can then be supplied to the input logic block 412 of the buck/boost regulator 420.

Figure 5:
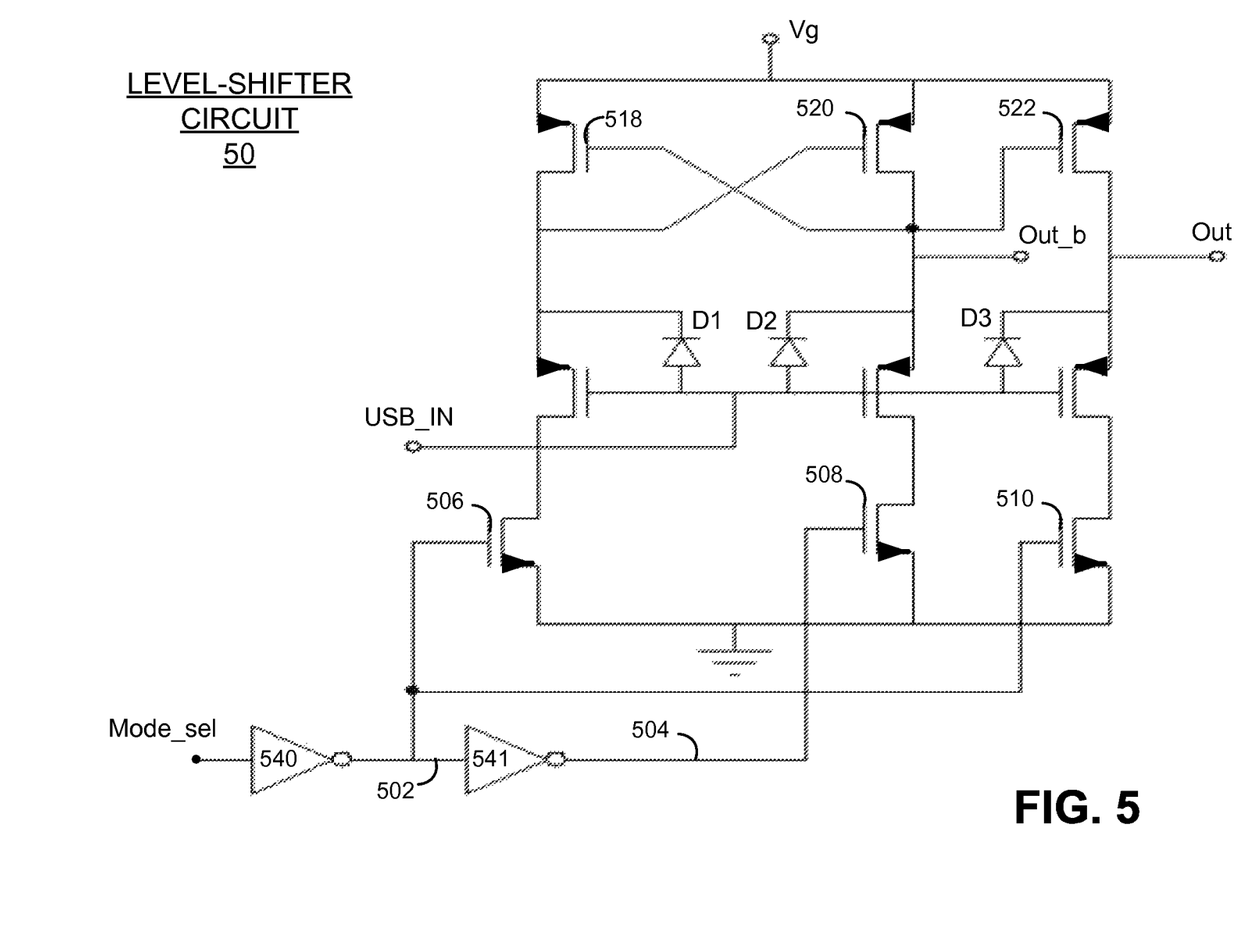
FIG. 5 depicts an example circuit diagram of a level-shifter circuit.

FIG. 5 depicts an example circuit diagram of a level shifter circuit configuration. In the illustrated embodiment, level shifter circuit 50 is configured to receive at its input (1) the mode_sel signal, (2) the USB_IN power signal, and (3) the input voltage signal Vg. The level shifter circuit is configured to supply complementary output voltages at outputs Out and Out_b.

It should be noted that level shifter circuits are well known and the embodiments described herein are not limited to any particular circuit configuration so long as it provides complementary outputs where output Out is equal to Vg and output Out_b is equal to USB_IN−ΔV, or output Out is equal to USB_IN−ΔV and output Out_b is equal to Vg. As discussed above, USB_IN−ΔV can be selected such that it is low enough to turn off the current sensing transistors SFET_Chg and SFET_RB of FIGS. 2-4.

As shown, mode_sel input signal is inverted at inverting node 502 via a first inverter 540 and inverted again at (non-inverting) node 504 via a second inverter 541. The inverted mode_sel signal at the inverting node 502 is supplied to activate transistors 506 and 510 and the non-inverted mode_sel signal at the non-inverting node 504 is supplied to activate transistor 508.

During forward current mode, power flows into the circuit from USB_IN and the state of the mode_sel signal is set equal to 0. This in turn will set the state of inverting node 502 equal to 1 via inverter 540 and the noninverting node 504 equal to 0 via inverter 541. In this configuration, inverting node 502 will activate transistors 506 and 510 and noninverting node 504 will deactivate transistor 508. The output voltage at output Out_b will therefore be the voltage USB_IN minus the voltage ΔV of the conducting diode D2, and the output voltage at output Out will be the input voltage Vg conducting down through transistor 522.

During reverse current mode, the state of the mode_sel signal is set equal to 1. This in turn will set the state of inverting node 502 equal to 0 via inverter 540 and the noninverting node 504 equal to 1 via inverter 541. In this configuration, inverting node 502 will deactivate transistors 506 and 510 and noninverting node 504 will activate transistor 508. The output voltage at output Out_b will therefore be the input voltage Vg conducting down through transistors 518 and 520 and the output voltage at the output Out will be the voltage USB_IN minus the voltage ΔV of the conducting diode D3.

Thus, the level shifter circuit 50 in this configuration is adapted to supply complementary voltages Vg and USB_IN at the outputs Out and Outb respectively during forward or reverse current mode. Other equivalent circuit configurations are possible.

II. Exemplary Processes

The processes described below are exemplary in nature and are provided for illustrative purposes and not intended to limit the scope of the embodiments described herein to any particular example embodiment. For instance, processes in accordance with some embodiments may include or omit some or all of the operations described below, or may include steps in a different order than described herein. The particular processes described are not intended to be limited to any particular set of operations exclusive of all other potentially intermediate operations.

In addition, the operations may be embodied in computer-executable code, which causes a general-purpose or special-purpose computer to perform certain functional operations. In other in stances, these operations may be performed by specific hardware components or hardwired circuitry, or by any combination of programmed computer components and custom hardware circuitry.

Figure 6A:
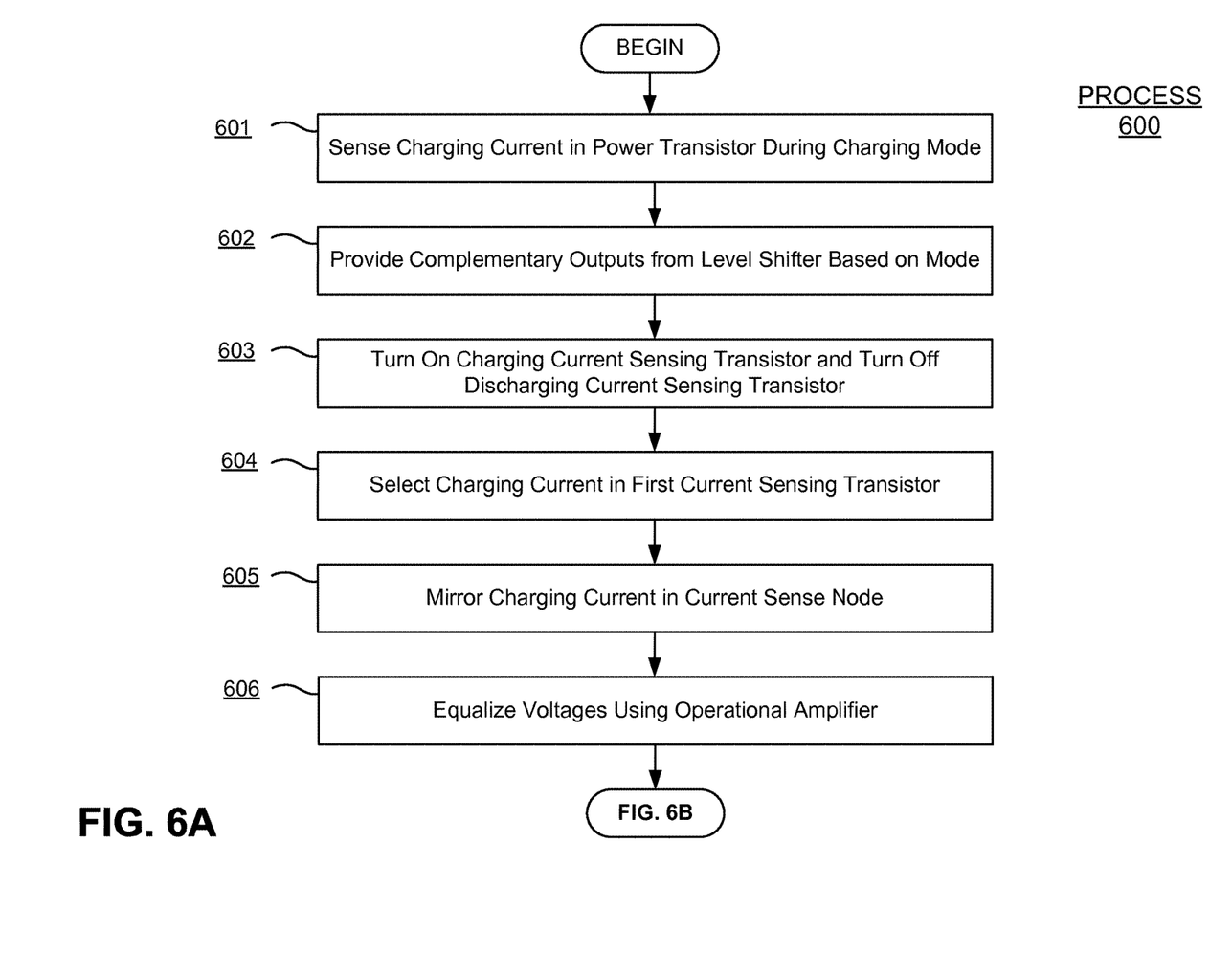
FIG. 6A depicts an example flow chart of an embodiment of a process for sensing a forward current in a bi-directional current sensing circuit designed according to the techniques described herein.

FIG. 6A depicts an example flow chart of an embodiment of a process for sensing a forward current in a bi-directional current sensing circuit designed according to the techniques described herein with reference to FIG. 2 above. In the illustrated embodiment, process 600 begins at operation 601 where the current conducting in the power transistor during forward current mode is sensed at a first current sensing transistor coupled between a current sensing node of the circuit and a first terminal of the power transistor. In one embodiment, the first terminal of the power transistor is the source terminal.

Process 600 continues at operation 602 by providing complementary outputs from a level shifter 230 depending on the selected mode of the circuit. The level shifter 230 includes a first output coupled with the gate terminal of the first current sensing transistor SFET_Chg to activate or deactivate the first current sensing transistor and a second output coupled with the gate terminal of a second current sensing transistor SFET_RB to activate or deactivate the second current sensing transistor. As shown, the circuit 20 comprises two current sensing loops but only one of the current sensing loops may be active at any one time based on the complementary outputs of the level shifter.

Process 600 continues at operation 603 by turning on the first current sensing transistor SFET_Chg and turning off the second current sensing transistor SFET_RB via the complementary outputs of the level shifter 230 since the circuit is in forward current mode. The forward current conducting in the power transistor FP_FET sensed in the first current sensing transistor SFET_Chg is then selected (operation 604), and the forward current is mirrored in the current sensing node 203 of the circuit (operation 605). The voltage of the first terminal of the power transistor FP_FET can then be equalized with the voltage of the corresponding terminal of the first current sensing transistor SFET_Chg using an operational amplifier 204 (operation 606).

Figure 6B:
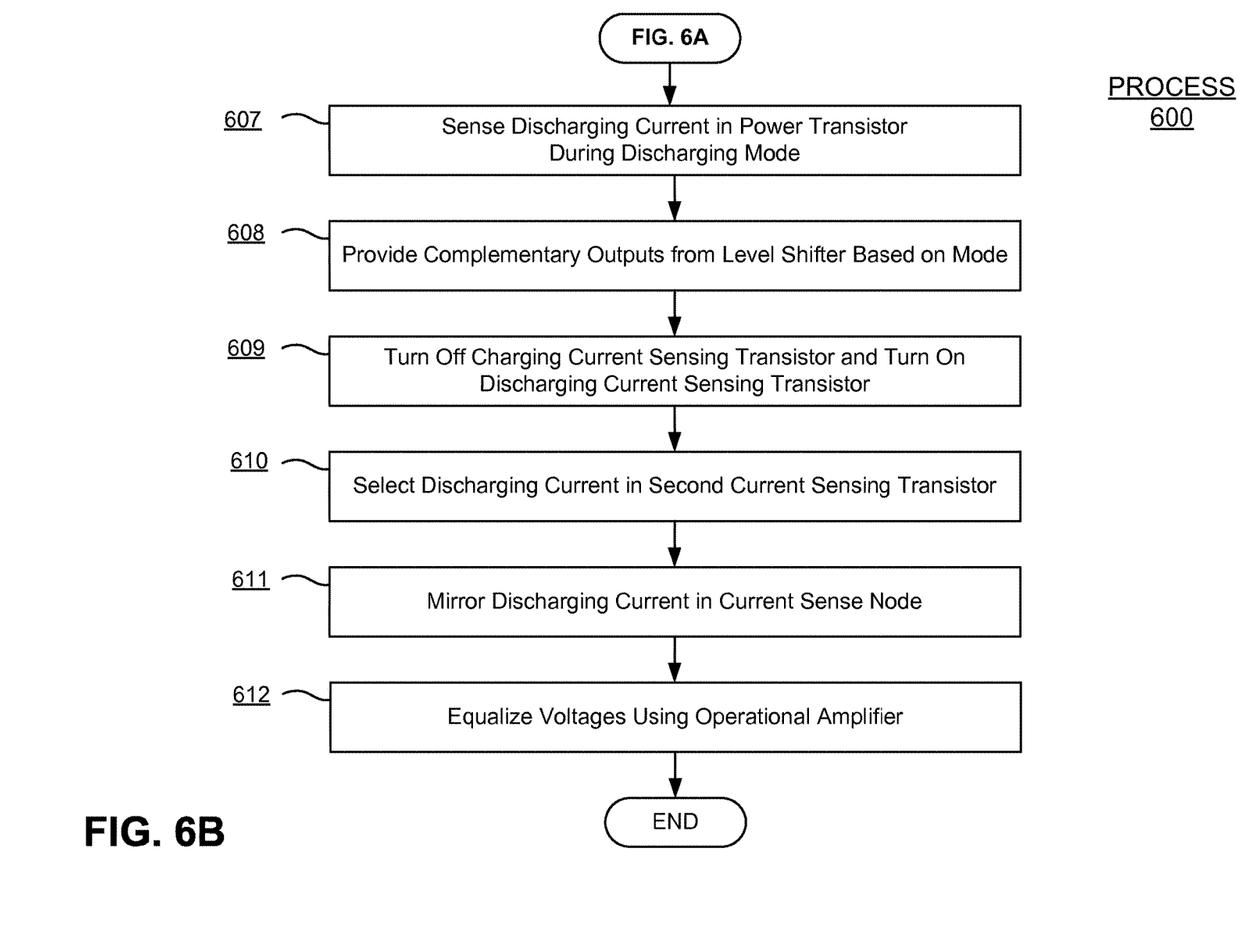
FIG. 6B depicts an example flow chart of an embodiment of a process for sensing a reverse current in a bi-directional current sensing circuit designed according to the techniques described herein.

Process 600 continues at FIG. 6B, which depicts an example flow chart of an embodiment of a process for sensing a reverse current in a bi-directional current sensing circuit designed according to the techniques described herein with reference to FIG. 2 above. In the illustrated embodiment, process 600 continues at operation 607 where the current conducting in the power transistor FP_FET during reverse current mode is sensed at a second current sensing transistor SFET_RB coupled between the current sensing node 203 of the circuit and a second terminal of the power transistor. In one embodiment, the second terminal of the power transistor FP_FET is the drain terminal.

Process 600 continues at operation 608 by providing complementary outputs from a level shifter 230 depending on the mode of the circuit. The level shifter 230 includes a first output coupled with the gate terminal of the first current sensing transistor SFET_Chg to activate or deactivate the first current sensing transistor and a second output coupled with the gate terminal of a second current sensing transistor SFET_RB to activate or deactivate the second current sensing transistor.

Process 600 continues at operation 609 by turning on the second current sensing transistor SFET_RB and turning off the first current sensing transistor SFET_Chg via the complementary outputs of the level shifter 230 since the circuit is in reverse current mode. The reverse current of the power transistor FP_FET sensed in the second current sensing transistor SFET_RB is then selected (operation 610) and the sensed current is mirrored in the current sensing node 203 of the circuit (operation 611). The voltage of the second terminal of the power transistor can then be equalized with the voltage of the corresponding terminal of the second current sensing transistor using the operational amplifier 204 (operation 612). This completes process 600 according to one example embodiment.

III. Advantages

The proposed solution is therefore capable of current sensing in applications with bi-directional power flow. The proposed solution provides an area-efficient bi-directional current sensing solution where current sensing is required in both the forward and reverse current directions. The embodiments described herein are adapted to combine two unidirectional current sensing feedback loops into a single bi-directional current sensing circuit.

In addition, the circuit is configured to mirror the current flowing in the power transistor directly in a single mirroring stage in such a manner that multiple stages of indirect current mirroring and matching is not required. The current flowing in the forward or reverse current directions can be directly mirrored in either the forward current sensing transistor or the reverse current sensing transistor, respectively. Such a technique can achieve an area savings of around 45% as compared to the dual-loop designs of conventional designs.

The embodiments described herein can also reduce testing time during design parameter trimming. Since some design parameters vary with processing variations and may mismatch from chip to chip, chip-level measurements are required to trim them back to a desired value. The sense ratio can vary with mismatch and layout parasitics, for example. This can be corrected by trimming the resistor R1 such that the overall sense gain is corrected to the desired value for each individual chip during testing. Since the trimming is done on each chip, it adds to the cost and test time. But the bi-directional current sensing technique described herein only requires trimming in one direction, which improves accuracy and reduces testing time during manufacturing.

It should be noted that the techniques described herein are not limited to any particular component or device. The novel techniques are generic and nature and can be extended to current sensing in any bi-directional power component or configuration. Those of skill would further appreciate that the various illustrative logical blocks, modules, circuits, and algorithm steps described in connection with the embodiments disclosed herein may be implemented as electronic hardware, computer software, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments described herein.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine, etc. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled with the processor such that the processor can read information from, and write information to, the storage medium. In the alternative, the storage medium may be integrated into the processor.

To the extent the embodiments described herein are implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

Throughout the foregoing description, for the purposes of explanation, numerous specific details were set forth in order to provide a thorough understanding of the invention. It will be apparent, however, to persons skilled in the art that these embodiments may be practiced without some of these specific details. The above examples and embodiments should not be deemed to be the only embodiments, and are presented to illustrate the flexibility and advantages of the present invention. Other arrangements, embodiments, implementations and equivalents will be evident to those skilled in the art and may be employed without departing from the spirit and scope of the invention as defined by the following claims.

What is claimed is:

1. A circuit for sensing current conducting in a power transistor coupled between an input power supply and a power regulator, the circuit comprising:
   a first current loop comprising a first current sensing transistor coupled between a first terminal of the power transistor and a current sensing circuit node coupled to a current sensing circuit, the first current loop configured to sense current conducting in the power transistor during a forward current mode of the circuit;
   a second current loop comprising a second current sensing transistor coupled between the current sensing circuit node and a second terminal of the power transistor, the second current loop configured to sense current conducting in the power transistor during a reverse current mode of the circuit,
   wherein only one of the first current sensing loop and the second current sensing loop is active at a time based on whether the circuit is in the forward current mode or the circuit is in the reverse current mode.

2. The circuit of claim 1 further including a level shifter configured to provide complementary outputs based on the circuit mode, the level shifter having a first output coupled with a gate terminal of the first current sensing transistor to activate or deactivate the first current sensing transistor, and a second output coupled with a gate terminal of the second current sensing transistor to activate or deactivate the second current sensing transistor wherein the complementary outputs of the level shifter are configured to either turn on the first current sensing transistor and turn off the second current sensing transistor when the circuit is in forward current mode, or turn off the first current sensing transistor and turn on the second current sensing transistor when the circuit is in reverse current mode.

3. The circuit of claim 1 wherein the first current sensing loop comprises the first current sensing transistor coupled with an operational amplifier, wherein the operational amplifier is configured to equalize voltage of the first terminal of the power transistor with a voltage of a corresponding terminal of the first current sensing transistor.

4. The circuit of claim 3 wherein the first terminal of the power transistor is its source terminal and the operational amplifier is configured to equalize a voltage signal of the source terminal of the power transistor with a voltage signal of a corresponding source terminal of the first current sensing transistor.

5. The circuit of claim 3 wherein the second current sensing loop comprises the second current sensing transistor coupled with the operational amplifier, wherein the operational amplifier is configured to equalize voltage of the second terminal of the power transistor with a voltage of a corresponding terminal of the second current sensing transistor.

6. The circuit of claim 5 wherein the second terminal of the power transistor is its drain terminal and the operational amplifier is configured to equalize a voltage signal of the drain terminal of the power transistor with a voltage signal of a corresponding drain terminal of the second current transistor.

7. The circuit of claim 1 further comprising selection logic configured for selecting between sensing forward current and reverse current in the power transistor based on the mode of the circuit.

8. The circuit of claim 7 wherein output of the selection logic will either be a signal conveying a voltage at the first terminal of the power transistor during forward current mode or a signal conveying a voltage at the second terminal of the power transistor during reverse current mode.

9. The circuit of claim 7 wherein the selection logic includes a multiplexer and the output of the multiplexer is provided to one input of an operational amplifier, and wherein the other input of the operational amplifier is supplied with either a sensed voltage at the first current sensing transistor in forward current mode or a sensed voltage at the second current sensing transistor in reverse current mode.

10. The circuit of claim 1 further comprising a buffer circuit adapted to buffer current conducting in the current sensing circuit node of the circuit and to provide a buffered voltage to the power regulator.

11. A method for sensing current conducting in a power transistor coupled between an input power supply and a power regulator, the method comprising:
    sensing current conducting in the power transistor during a forward current mode of the circuit with a first current loop comprising a first current sensing transistor coupled between a first terminal of the power transistor and a current sensing circuit node;
    sensing current conducting in the power transistor during a reverse current mode of the circuit with a second current loop comprising a second current sensing transistor coupled between the current sensing circuit node and a second terminal of the power transistor,
    wherein the first and second current sensing transistors form a series connection in parallel with the power transistor;
    and
    activating only one of the first current sensing loop and the second current sensing loop based on whether the circuit is in the forward current mode or the reverse current mode.

12. The method of claim 11 further comprising providing complementary outputs from a level shifter based on a selected mode of the circuit, the level shifter having a first output coupled with a gate terminal of the first current sensing transistor to activate or deactivate the first current sensing transistor, and a second output coupled with a gate terminal of the second current sensing transistor to activate or deactivate the second current sensing transistor and either turning on the first current sensing transistor and turning off the second current sensing transistor when the circuit is in forward current mode, or turning off the first current sensing transistor and turning on the second current sensing transistor when the circuit is in reverse current mode.

13. The method of claim 11 further comprising equalizing voltage of the first terminal of the power transistor with a voltage of a corresponding terminal of the first current sensing transistor using an operational amplifier.

14. The method of claim 11 further comprising equalizing voltage of the second terminal of the power transistor with a voltage of a corresponding terminal of the second current sensing transistor using an operational amplifier.

15. The method of claim 11 further comprising selecting between sensing forward and reverse currents in the power transistor based on the selected mode of the circuit.

16. The method of claim 11 further comprising either mirroring forward current of the power transistor during forward current mode or mirroring reverse current of the power transistor during reverse current mode.

17. The method of claim 11 further comprising buffering sensed current conducting in a current sensing circuit node and providing a buffered voltage to the power regulator.

18. A circuit means for sensing current conducting in a power transistor coupled between an input power supply and a power regulator, the circuit means comprising:
    means for sensing forward current conducting in the power transistor during a forward current mode of the circuit at a first current sensing transistor coupled between a first terminal of the power transistor and a current sensing circuit node in a first current loop;
    means for sensing reverse current conducting in the power transistor during a reverse current mode of the circuit at a second current sensing transistor coupled between the current sensing circuit node and a second terminal of the power transistor in a second current loop,
    wherein the first and second current sensing transistors form a series connection in parallel with the power transistor; and
    means for activating only one of the first current sensing loop and the second current sensing loop comprising at a time based on whether the circuit is in the forward current mode or the reverse current mode.

19. The circuit means of claim 18 further comprising means for providing complementary outputs from a level shifter based on a selected mode of the circuit, the level shifter having a first output coupled with a gate terminal of the first current sensing transistor to activate or deactivate the first current sensing transistor, and a second output coupled with a gate terminal of the second current sensing transistor to activate or deactivate the second current sensing transistor; and
    wherein said activating means includes a means for either turning on the first current sensing transistor and turning off the second current sensing transistor when the circuit is in forward current mode, or turning off the first current sensing transistor and turning on the second current sensing transistor when the circuit is in reverse current mode.

20. The circuit means of claim 18 further comprising a means for equalizing voltage of the first terminal of the power transistor with a voltage of a corresponding terminal of the first current sensing transistor using an operational amplifier.

21. The circuit means of claim 18 further comprising a means for equalizing voltage of the second terminal of the power transistor with a voltage of a corresponding terminal of the second current sensing transistor using an operational amplifier.

22. The circuit means of claim 18 further comprising a means for selecting between sensing forward current and reverse current in the power transistor based on the selected mode of the circuit.

23. The circuit means of claim 18 further comprising a means for either mirroring forward current of the power transistor during forward current mode or mirroring reverse current of the power transistor during reverse current mode.

24. The circuit means of claim 18 further comprising a means for buffering sensed current conducting in the current sensing circuit node and for providing a buffered voltage to the power regulator.

25. A circuit for sensing current conducting in a power transistor, the circuit comprising:
    a first current loop comprising a first current sensing transistor coupled between a first terminal of the power transistor and a first node, the first current loop configured to sense current conducting in the power transistor during a charging mode and comprising a first amplifier; and a second current loop comprising a second current sensing transistor coupled between the first node and a second terminal of the power transistor, the second current loop configured to sense current conducting in the power transistor during a discharging mode and comprising the first amplifier.

26. The circuit of claim 25 wherein the first node is coupled to a first input of the first amplifier.

27. The circuit of claim 26 further comprising a multiplexer having a first input, a second input, and an output, wherein the output is coupled to a second input of the first amplifier.

28. The circuit of claim 27 wherein the first input is coupled to the first terminal and wherein the second input is coupled to the second terminal.

29. The circuit of claim 28 wherein the multiplexer is configured to select the second input during the charging mode and to select the first input during the discharging mode.

30. The circuit of claim 25 further comprising a second circuit configured to turn off the first current sensing transistor when the second current sensing transistor is turned on, and to turn off the second current sensing transistor when the first current sensing transistor is turned on.

* * * * *